(12) United States Patent
Itoh

(10) Patent No.: US 7,629,088 B2
(45) Date of Patent: Dec. 8, 2009

(54) MASK DEFECT REPAIRING METHOD AND SEMICONDUCTOR DEVICE MANUFACTURING METHOD

(75) Inventor: Masamitsu Itoh, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 479 days.

(21) Appl. No.: 11/504,049

(22) Filed: Aug. 15, 2006

(65) Prior Publication Data

US 2007/0048631 A1 Mar. 1, 2007

(30) Foreign Application Priority Data

Aug. 24, 2005 (JP) ............... 2005-243139

(51) Int. Cl.
*G03F 1/00* (2006.01)
(52) U.S. Cl. ............................ 430/5; 430/30
(58) Field of Classification Search ............ 430/5, 430/30
See application file for complete search history.

(56) References Cited

U.S. PATENT DOCUMENTS 6,627,362 B2 * 9/2003 Stivers et al. ............ 430/5
6,753,538 B2 * 6/2004 Musil et al. ............ 250/492.2
2003/0124312 A1 7/2003 Autumn
2004/0175631 A1 9/2004 Crocker et al.

FOREIGN PATENT DOCUMENTS

| JP | 4-237054 | 8/1992 |
| JP | 2002-62637 | 2/2002 |
| JP | 2005-84582 | 3/2005 |

OTHER PUBLICATIONS

Machine Translation of JP-2005-084582 A.*

* cited by examiner

*Primary Examiner*—S. Rosasco
*Assistant Examiner*—Stewart A Fraser
(74) *Attorney, Agent, or Firm*—Finnegan, Henderson, Farabow, Garrett & Dunner, L.L.P.

(57) ABSTRACT

According to an aspect of the invention, there is provided a mask defect repairing method of repairing a defect caused by a foreign object on a light transmissive photomask, the method including moving the foreign object on a light transmission section of the light transmissive photomask using a manipulator, and placing the foreign object on a shielding section of the light transmissive photo mask.

16 Claims, 4 Drawing Sheets

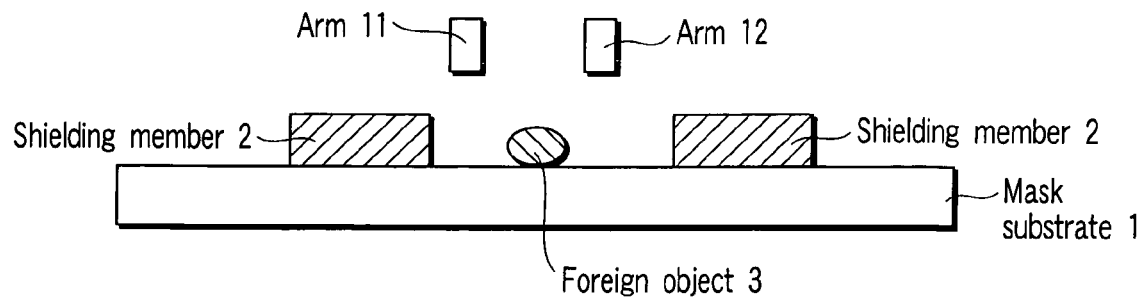
F I G. 2A
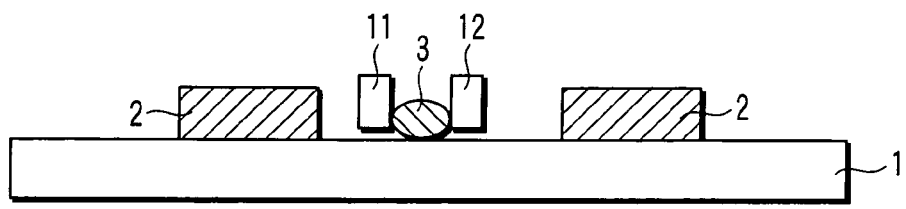
F I G. 2B
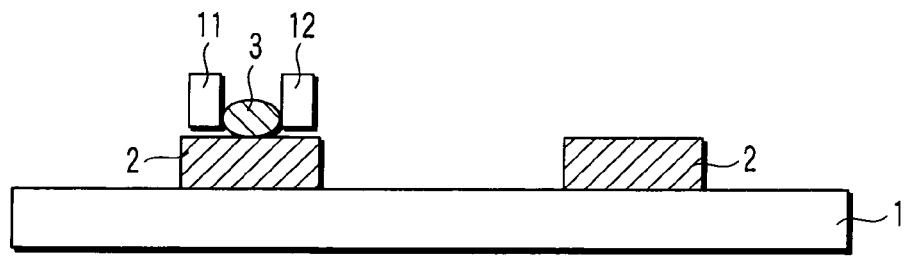
F I G. 2C
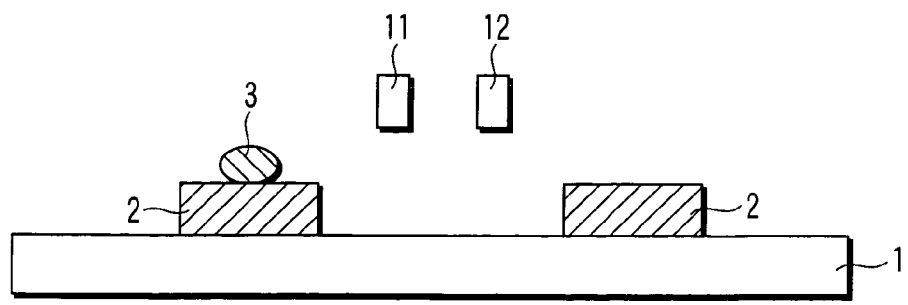
F I G. 2D

MASK DEFECT REPAIRING METHOD AND SEMICONDUCTOR DEVICE MANUFACTURING METHOD

CROSS-REFERENCE TO RELATED APPLICATIONS

This application is based upon and claims the benefit of priority from prior Japanese Patent Application No. 2005-243139, filed Aug. 24, 2005, the entire contents of which are incorporated herein by reference.

BACKGROUND OF THE INVENTION

1. Field of the Invention

The present invention relates to a mask defect repairing method of repairing a defect on a photomask, particularly defects caused by foreign objects adhering to the photomask after pattern formation, as well as a related semiconductor device manufacturing method.

2. Description of the Related Art

In recent years, a photolithography step for a semiconductor manufacture process has had an increasingly significant challenge. An increasing reduction in the sizes of semiconductor devices has resulted in a growing demand for a reduction in the sizes of materials used in the photolithography step. Very high accuracy has been requested; the device design rule has already been reduced down to 45 nm and a pattern size to be controlled is at most 4 nm.

Very high accuracy is also requested for detection of defects in a photomask. Specifically, even defects of at most about 40 nm size must be able to be detected on a photomask.

What is called a defect repairing apparatus has been used to repair defects on photomasks. Specifically, conventional defect repairing techniques include evaporation of defects using laser beams which is described in Jpn. Pat. Appln. KOKAI Publication No. 2002-62637, etching of defects using focused ion beams (FIBs) or repair of defects by deposition which is described in Jpn. Pat. Appln. KOKAI Publication No. 4-237054, and etching of defects using a microprobe to which atomic force microscopy (AFM) is applied.

Defects that are difficult to repair have frequently resulted from a decrease in the sizes of defects and patterns on masks associated with the reduced sizes of semiconductor devices. That is, what is called adhesion defects has become difficult to repair. The adhesion defects have been removed by washing or repaired as described above.

However, in particular, patterns called sub-resolution assist features (SRAFs) are too fine to be resolved on a wafer. SRAF is formed on a wafer immediately adjacent to a pattern to be formed and has a size of at most 80 nm on a mask. Defects adhering between these fine patterns are difficult to repair using laser beams. This is because the laser beams have such a large diameter that they may damage not only the defects but also peripheral patterns.

The FIB repair is also difficult because a quartz substrate may be damaged by FIB specific repair marks or ions remaining into the substrate; the repair marks are called riverbeds. AFM enables repairs but requires a long time to complete the repair. This poses a throughput problem. EUVL masks may cut defects too deep. It is thus difficult to use these masks to repair the defects without damaging a base substrate.

In spite of these circumstances, the number of adhesion defects increases exponentially with decreasing pattern size. Defect repairs thus require a very long time. This is a major factor that increases mask costs.

BRIEF SUMMARY OF THE INVENTION

According to an aspect of the invention, there is provided a mask defect repairing method of repairing a defect caused by a foreign object on a light transmissive photomask, the method comprising: moving the foreign object on a light transmission section of the light transmissive photomask using a manipulator; and placing the foreign object on a shielding section of the light transmissive photo mask.

According to another aspect of the invention, there is provided a mask defect repairing method of repairing a defect caused by a foreign object on a light reflective photomask, the method comprising: moving the foreign object on a light reflection section of the light reflective photomask using a manipulator; and placing the foreign object on a shielding section of the light reflective photomask.

According to another aspect of the invention, there is provided a semiconductor device manufacturing method of manufacturing a semiconductor device using a photomask, the method comprising: moving a foreign object on a light transmission section of a light transmissive photomask using a manipulator; and placing the foreign object on a shielding section of the light transmissive photomask to repair the defect in the photomask.

According to another aspect of the invention, there is provided a semiconductor device manufacturing method of manufacturing a semiconductor device using a photomask, the method comprising: moving a foreign object on a light reflection section of a light reflective photomask using a manipulator; and placing the foreign object on a shielding section of the light reflective photomask to repair the defect in the photomask.

BRIEF DESCRIPTION OF THE SEVERAL VIEWS OF THE DRAWING

FIGS. 2A, 2B, 2C, and 2D are sectional views showing steps in which the manipulator picks up and places adhering foreign objects on a shielding member according to the first embodiment;

DETAILED DESCRIPTION OF THE INVENTION

Embodiments of the present invention will be described below with reference to the drawings.

First, an ArF halftone (HT) blank was provided on which an electron beam resist had been coated. An electron beam mask drawing apparatus (EBM 5000 manufactured by NuFlare Technology, Inc.) was used to draw a device pattern for the 55-nm technology node on the blank.

A baking operation (PEB) was performed as is the case with a normal photomask manufacturing process. Alkali development was carried out to develop a resist pattern, which was then used as an etching mask to dry etch a CR or HT film.

An oxygen plasma operation was then performed to strip off the resist. The resulting structure was then washed using a wet washer.

The washed mask was inspected for defects using a defect inspecting apparatus (MC 3500 manufactured by Toshiba Machine Co., Ltd.). This results in finding 13 defects caused by pattern shape errors and 53 defects caused by adhering foreign objects in light transmission sections. The 13 defects caused by pattern shape errors were repaired with a defect repairing apparatus that uses FIB or AFM. The 53 defects caused by adhering foreign objects were repaired with a manipulator described below.

Figure 1:
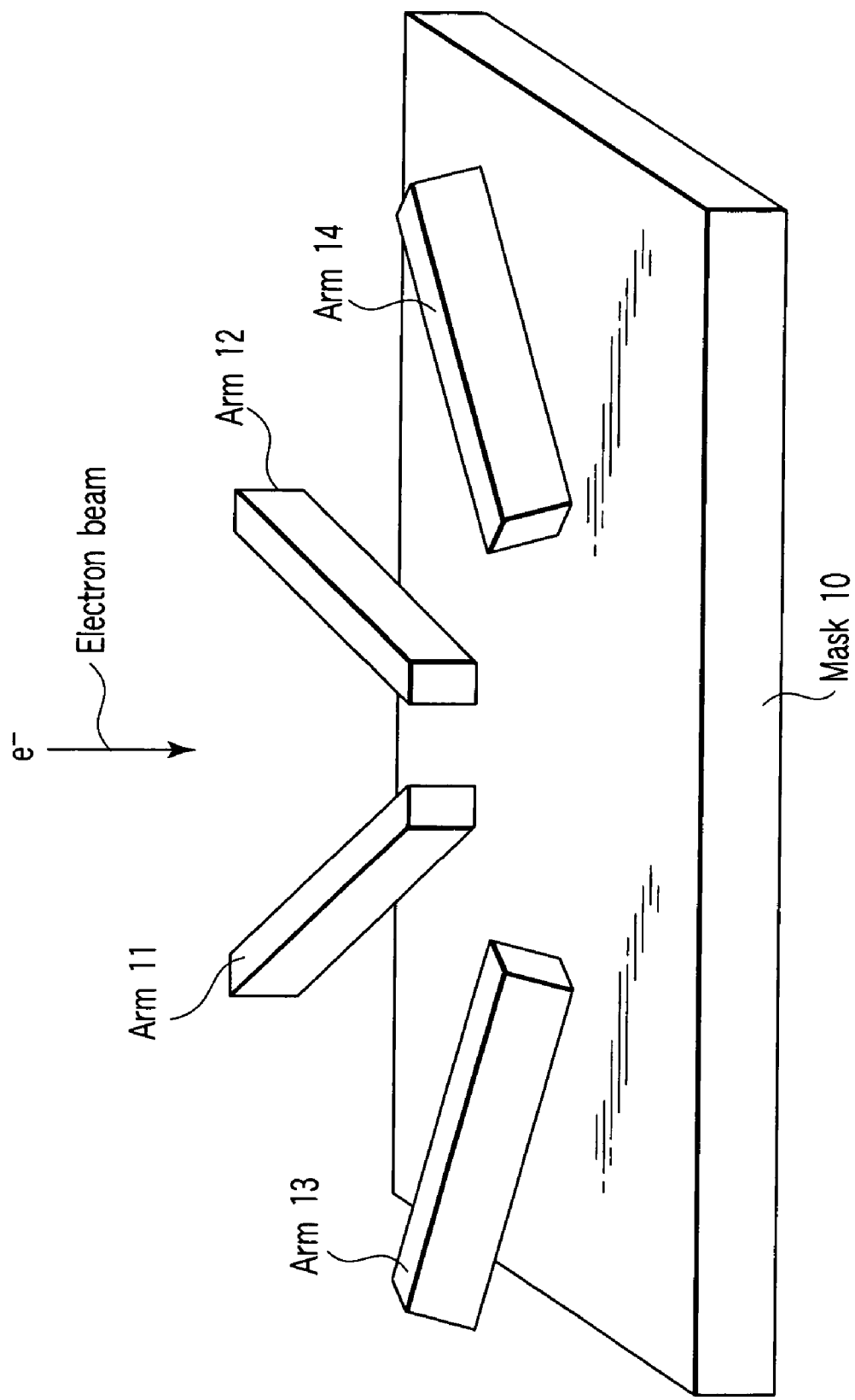
FIG. 1 is a conceptual drawing of a manipulator for a mask defect repairing method according to a first embodiment.

FIG. 1 is a conceptual drawing of a manipulator for a mask defect repairing method according to the first embodiment. This manipulator is composed of four microarms mounted in a scanning electron microscope (SEM). A photomask 10 (light transmissive photomask) to be inspected for defects is placed on a stage of the SEM.

Two arms 11 and 12 pick up adhering foreign objects on the mask 10. The remaining two arms 13 and 14 push and move the adhering foreign objects on the mask 10 in a lateral direction. The arms are driven by three piezoelectric elements (not shown) and can move by 100 μm in vertical and horizontal directions.

FIGS. 2A, 2B, 2C, and 2D are sectional views showing steps in which the manipulator picks up and places adhering foreign objects on a shielding member. Repairs were made on 38 (foreign objects 3) of the 53 adhering foreign objects in light transmission sections on a mask substrate (quartz substrate) 1; the 38 foreign objects were easier to pick up. A series of operations described below are performed by an operator using a manipulator with observations made using the SEM.

First, as shown in FIG. 2A, the arms 11 and 12 are arranged above the target foreign object 3. As shown in FIG. 2B, the arms 11 and 12 are lowered to the mask substrate 1 and sandwich the foreign object 3 between themselves.

The arms 11 and 12 are manipulated to pick up the foreign object 3, which was thus placed on a nearby shielding member 2 as shown in FIG. 2C. The arms 11 and 12 subsequently release the foreign object 3 as shown in FIG. 2D.

Figure 3A:
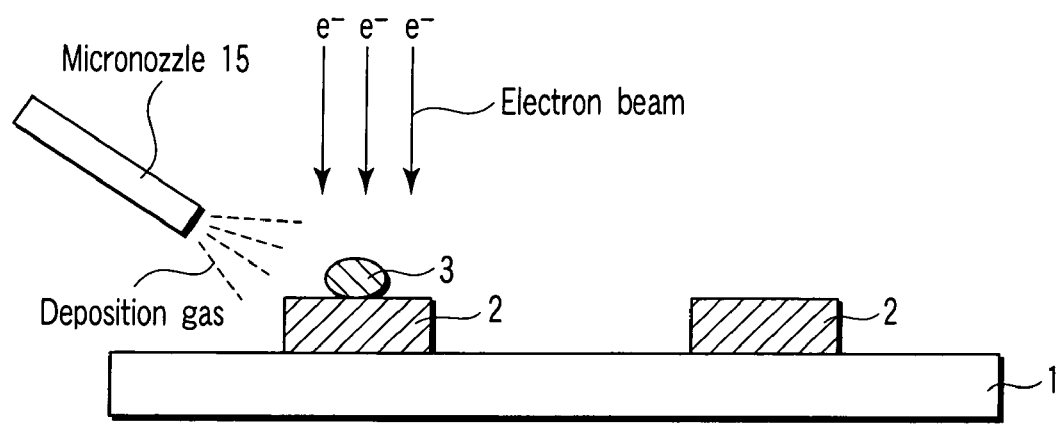
FIGS. 3A and 3B are sectional views showing a step in which a deposit is used to secure the foreign objects according to the first embodiment.
Figure 3B:
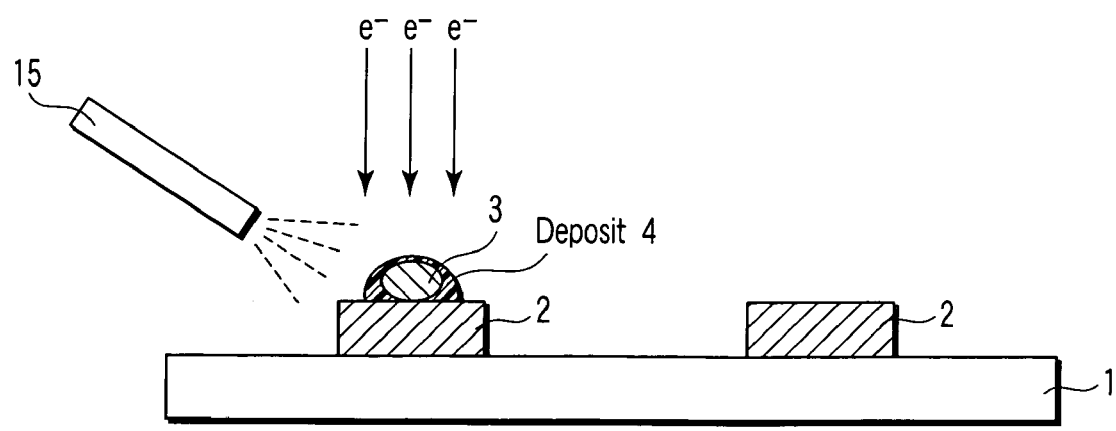

FIGS. 3A and 3B are sectional views showing a step in which a deposit is used to secure the foreign objects. As shown in FIG. 3A, the foreign object 3 placed on the shielding member 2 is intensively irradiated with electron beams (charge beams) emitted from above the foreign object 3; the electron beams are used for observations made using the SEM. At the same time, a micronozzle 15 installed adjacent to the arms and obliquely above the foreign object 3 ejects a deposition gas containing carbon to the foreign object 3.

As a result, as shown in FIG. 3B, a deposit 4 consisting of organic matter accumulates so as to cover the foreign object 3. The foreign object 3 moved onto the shielding member 2 is thus secured to the shielding member 2. This prevents the foreign object 3 from moving again to adhere to the mask substrate 1.

FIGS. 4A, 4B, 4C, 4D, and 4E are sectional views showing steps of a mask defect repairing method according to a second embodiment in which the adhering foreign objects are pushed and moved on a mask substrate in a lateral direction. The same components in FIGS. 4A, 4B, 4C, 4D, and 4E as those in FIGS. 2A, 2B, 2C, and 2D are denoted by the same reference numerals. Repairs were made on 15 (foreign objects 31) of the 53 adhering foreign objects in light transmission sections on the mask substrate (quartz substrate) 1; the 15 foreign objects were not easy to pick up. A series of operations described below are performed by an operator using a manipulator with observations made using the SEM.

Figure 4A:
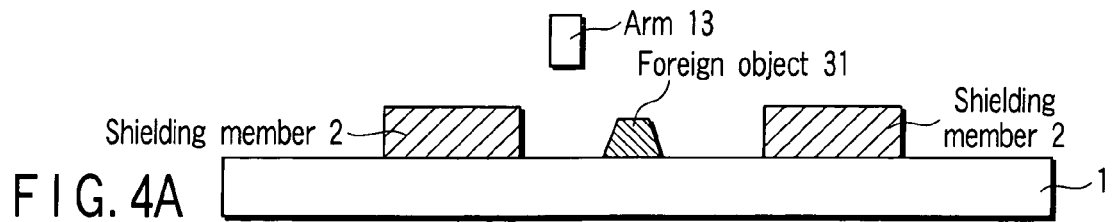
FIGS. 4A, 4B, 4C, 4D, and 4E are sectional views showing steps of a mask defect repairing method according to a second embodiment in which the adhering foreign objects are pushed and moved on a mask substrate in a lateral direction.
Figure 4B:
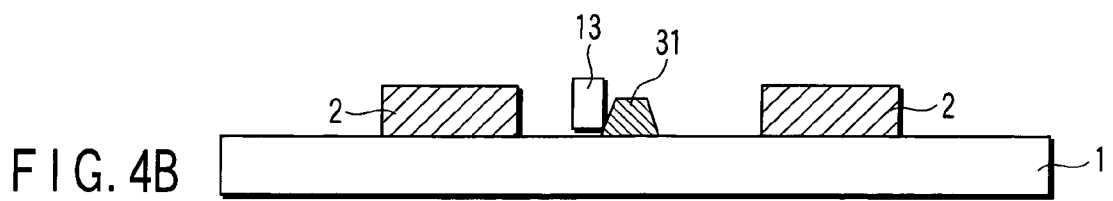

First, as shown in FIG. 4A, the arm 13 is placed obliquely above the target foreign object 31. As shown in FIG. 4B, the arm 13 is lowered to a side of the foreign object 31 on the mask substrate 31.

Figure 4C:
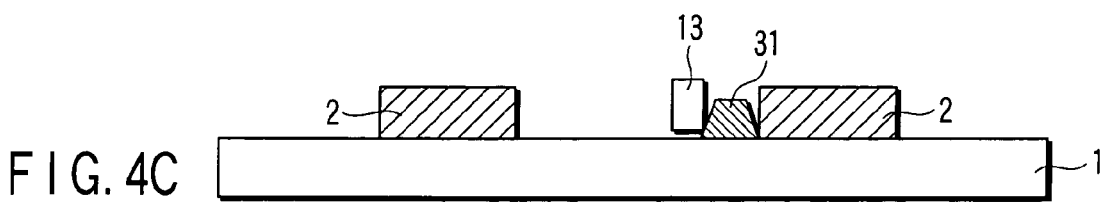
Figure 4D:
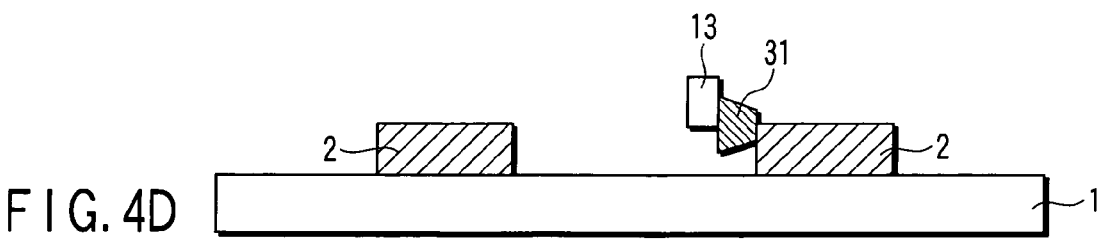
Figure 4E:
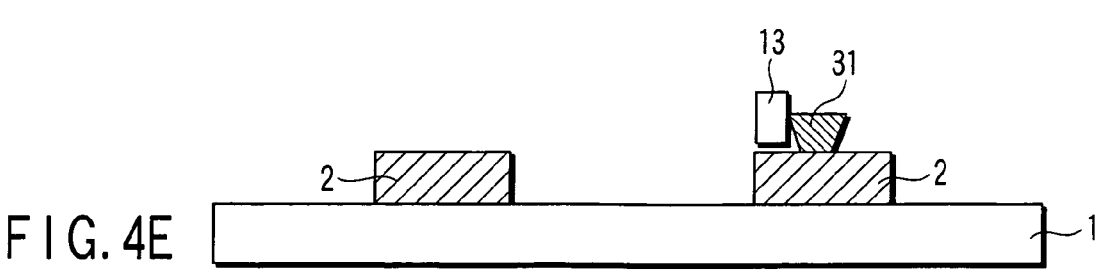

Then, as shown in FIG. 4C, the arm 13 pushes the foreign object 31 from its side and moves it to the nearby shielding member 2 with the foreign object 31 remaining in contact with the mask substrate 1. The arm 13 is then raised with the foreign object 31 pressed against a side of the shielding member 2 as shown in FIG. 4D. The foreign object 31 is thus pushed onto (placed on) the shielding member 2 as shown in FIG. 4E. The foreign object 31 is subsequently covered with organic matter and secured to the shielding member 2 as is the case with the first embodiment.

The first and second embodiments required only about 40 seconds to repair a defect caused by one adhering foreign object. The time required to repair 53 defects was only about 45 minutes; this time included the time required to position mask defects on an observation axis by moving the stage in the SEM on the basis of defect position coordinate information.

About 7 minutes are required to repair one defect by using AFM to etch the adhering foreign object as in the prior art. Moreover, a probe used must be replaced after about 20 defects have been repaired. Thus, the time required to repair 53 defects using a conventional technique was about 7 hours; this time included the time required to replace and adjust the probe. However, the present embodiment enables adhering foreign objects to be reliably removed in a short time as described above. This sharply reduces the costs and time required to manufacture masks.

A photomask subjected to defect repairs as described above is then washed and inspected again for defects by the defect inspecting apparatus. After confirmation of absence of a defect, a pellicle is stuck to the photomask. A wafer exposure apparatus subsequently uses this photomask to expose a semiconductor wafer. A semiconductor device is finally manufactured from the semiconductor wafer.

Figure 5:
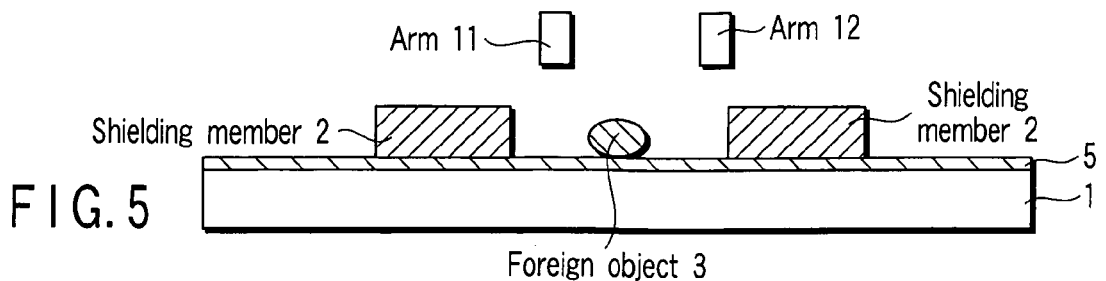
FIG. 5 is a sectional view showing the configuration of an EUVL reflective mask according to a variation of the embodiment.

The present invention is not limited to the above embodiments. The deposit used to secure the foreign object to the shielding member is not limited to the organic matter (containing carbon) but may be a substance containing silicon or metal. Further, the micronozzle may eject an adhesive to secure the foreign object. Moreover, the photomask subjected to defect repairs is not limited to an ArF HT mask. The mask defect repairing method according to the present embodiment is also applicable to, for example, an EUVL light transmissive photomask having a multiplayer film 5 (light reflection section) on the mask substrate 1 as shown in FIG. 5.

In the above embodiments, defects are repaired which are caused by foreign objects adhering to a photomask after a pattern has been formed on the mask. With a light transmissive photomask, a manipulator can be used to move a foreign object adhering to a light transmission section between shielding member patterns, to a nearby shielding member pattern. This enables the elimination of adverse effect of the foreign object during wafer exposure.

Similarly, with an EUVL light reflective photomask, a manipulator can be used to move a foreign object adhering to a multiplayer film between shielding member patterns, to a nearby shielding member pattern. This enables the elimination of adverse effect of a foreign object during wafer exposure.

Further, a securing operation is performed on the shielding member pattern in order to prevent a foreign object placed on the shielding member pattern from moving again during mask washing or the like to cause a defect.

This enables the simplification of repairs of defects caused by adhering foreign objects on the photomask. This in turn sharply reduces the time required for defect repairs and also reduces the mask costs and the time required for delivery (TAT). This further makes it possible to reduce the costs of semiconductor devices manufactured using the photomask subjected to defect repairs as well as the time required to deliver the semiconductor devices.

The present embodiment can provide a mask defect repairing method and a semiconductor device manufacturing method which sharply reduce the time required to repair defects in a mask, thus reducing the manufacturing costs and period of the mask.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask defect repairing method of repairing a defect caused by a foreign object on a light transmissive photomask, the method comprising:
    moving the foreign object on a light transmission section of the light transmissive photomask wherein movement of the foreign object is achieved by picking up or pushing the foreign object; and
    placing the foreign object on a shielding section of the light transmissive photomask wherein after being place on the shielding section, the foreign object is secured to the shielding section.

2. The mask defect repairing method according to claim 1, wherein the foreign object is covered with organic matter and secured to the shielding section.

3. The mask defect repairing method according to claim 1, wherein the foreign object is covered with a substance containing silicon or metal and secured to the shielding section.

4. The mask defect repairing method according to claim 1, wherein the foreign object is secured using an adhesive.

5. The mask defect repairing method according to claim 1, wherein the foreign object is secured using electron beams and a deposition gas containing carbon.

6. The mask defect repairing method according to claim 1, wherein moving the foreign object is performed by a manipulator comprising a plurality of micro arms mounted in a scanning electron microscope.

7. The mask defect repairing method according to claim 6, wherein the manipulator is moved with observations made through the scanning electron microscope.

8. A mask defect repairing method of repairing a defect caused by a foreign object on a light reflective photomask, the method comprising:
    moving the foreign object on a light reflection section of the light reflective photomask wherein movement of the foreign object is achieved by picking up or pushing the foreign object; and
    placing the foreign object on a shielding section of the light reflective photomask wherein after being place on the shielding section, the foreign object is secured to the shielding section.

9. The mask defect repairing method according to claim 8, wherein the foreign object is covered with organic matter and secured to the shielding section.

10. The mask defect repairing method according to claim 8, wherein the foreign object is covered with a substance containing silicon or metal and secured to the shielding section.

11. The mask defect repairing method according to claim 8, wherein the foreign object is secured using an adhesive.

12. The mask defect repairing method according to claim 8, wherein the foreign object is secured using electron beams and a deposition gas containing carbon.

13. The mask defect repairing method according to claim 8, wherein moving the foreign object is performed by a manipulator comprising a plurality of micro arms mounted in a scanning electron microscope.

14. The mask defect repairing method according to claim 13, wherein the manipulator is moved with observations made through the scanning electron microscope.

15. A method of manufacturing a semiconductor device using a light transmissive photomask, the method comprising:
    preparing a semiconductor substrate;
    moving a foreign object on a light transmission section of the light transmissive photomask wherein movement of the foreign object is achieved by picking up or pushing the foreign object;
    placing the foreign object on a shielding section of the light transmissive photomask to repair the defect in the light transmissive photomask; wherein after being place on the shielding section, the foreign object is secured to the shielding section; and
    forming a predetermined pattern in or on the semiconductor substrate using the light transmissive photomask.

16. A method of manufacturing a semiconductor device using a light reflective photomask, the method comprising:
    preparing a semiconductor substrate;
    moving a foreign object on a light reflection section of the light reflective photomask wherein movement of the foreign object is achieved by picking up or pushing the foreign object;
    placing the foreign object on a shielding section of the light reflective photomask to repair the defect in the light reflective photomask wherein after being place on the shielding section, the foreign object is secured to the shielding section; and
    forming a predetermined pattern in or on the semiconductor substrate using the light reflective photomask.

* * * * *

UNITED STATES PATENT AND TRADEMARK OFFICE
CERTIFICATE OF CORRECTION

| | |
|---|---|
| PATENT NO. | : 7,629,088 B2 |
| APPLICATION NO. | : 11/504049 |
| DATED | : December 8, 2009 |
| INVENTOR(S) | : Itoh |

It is certified that error appears in the above-identified patent and that said Letters Patent is hereby corrected as shown below:

Claim 1, column 5, line 33, change "place" to --placed--.

Claim 8, column 6, line 6, change "place" to --placed--.

Claim 15, column 6, line 37, change "place" to --placed--.

Claim 16, column 6, line 51, change "place" to --placed--.

Signed and Sealed this

Ninth Day of February, 2010

David J. Kappos
*Director of the United States Patent and Trademark Office*